(12) United States Patent
Bocko et al.

(10) Patent No.: US 7,038,532 B1
(45) Date of Patent: May 2, 2006

(54) SWITCHED-CAPACITOR HIGH-PASS MIRRORED INTEGRATOR

(75) Inventors: Mark F. Bocko, Caledonia, NY (US); Zeljko Ignjatovic, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 10/824,623

(22) Filed: Apr. 15, 2004

Related U.S. Application Data

(60) Provisional application No. 60/462,712, filed on Apr. 15, 2003.

(51) Int. Cl.
*H03B 1/00* (2006.01)
*H03K 5/00* (2006.01)
*H04B 1/10* (2006.01)

(52) U.S. Cl. ............... 327/554; 327/559; 327/337; 330/9

(58) Field of Classification Search ............ 327/551, 327/552, 553, 554, 559, 336, 337, 345, 77, 327/87, 88, 89
See application file for complete search history.

(56) References Cited

U.S. PATENT DOCUMENTS

| | | | |
|---|---|---|---|
| 4,138,649 A * | 2/1979 | Schaffer | 330/9 |
| 4,988,900 A * | 1/1991 | Fensch | 327/337 |
| 5,703,589 A * | 12/1997 | Kalthoff et al. | 341/172 |
| 6,617,908 B1 * | 9/2003 | Thomsen et al. | 327/337 |
| 6,903,602 B1 * | 6/2005 | Cusinato | 327/552 |
| 2002/0186069 A1 * | 12/2002 | Hochschild | 327/337 |
| 2003/0146786 A1 * | 8/2003 | Gulati et al. | 330/9 |

OTHER PUBLICATIONS

"A Low Noise Chopper-Stabilized Differential Switched-Capacitor Filtering Technique", K. Hsieh, et al., IEEE Journal of Solid-State Circuits, vol. SC-16, No. 6, Dec. 1981.

"A 160-MHz Fourth-Order Double-Sampled SC Bandpass Sigma-Delta Modulator", S. Bazarjani, et al., IEEE Transaction on Circuits and Systems, II: Analog and Digital Signal Processing, Col. 45, No. 5, May 1998.

"Circuit Techniques for Reducing the Effects of Op-Amp Imperfections: Autozerong, Correlated Double Sampling, and Chopper Stablization", C. Enz, et al., Proceedings of the IEEE, vol. 84, No. 11, Nov. 1996.

"Bandpass Analog-To-Digital Conversion for Wireless Applications", A. Ong, Sep. 1998, Stanford University, Stanford.

* cited by examiner

*Primary Examiner*—Tuan T. Lam
(74) *Attorney, Agent, or Firm*—Blank Rome LLP

(57) ABSTRACT

In a high-pass (mirrored) integrator structure that employs chopper modulation, the input and output of the mirrored integrator are connected to the input and output ports of the operational amplifier, bypassing the chopper stabilization modulators. The mirrored integrator can be used in sigma-delta analog-to-digital converters.

12 Claims, 14 Drawing Sheets

$$Y(z) = \frac{z^{-1}}{1+z^{-1}} X(z)$$

$$Y(z) = \frac{1}{1+z^{-1}} X(z)$$

SWITCHED-CAPACITOR HIGH-PASS MIRRORED INTEGRATOR

REFERENCE TO RELATED APPLICATIONS

The present application claims the benefit of U.S. Provisional Application No. 60/462,712, filed Apr. 15, 2003. Related concepts are disclosed in U.S. Pat. No. 6,707,409, issued Mar. 16, 2004. The disclosures of the above-cited '712 provisional application and '409 patent are hereby incorporated by reference in their entireties into the present disclosure.

FIELD OF THE INVENTION

The present invention is directed to a high-pass filter and more particularly to a switched-capacitor high-pass filter implemented as a mirrored integrator for use in an analog-to-digital converter (ADC).

DESCRIPTION OF RELATED ART

An overview of the related art will now be provided. Reference numerals in brackets refer to references that will be listed at the end of this section.

Signal processing circuits that operate on signals that have been converted to a band near the Nyquist frequency promise to enable new capabilities as well as to offer performance enhancements in existing applications. An example of a circuit enabling new capabilities is a design for a two-path bandpass $\Sigma\Delta$ (sigma-delta) modulator proposed in [1]. In this design, an input IF signal is sampled at a rate four times the input signal carrier frequency. The signal samples are then interleaved between two channel paths at a rate equal to half of the sampling frequency. This results in a shift of the input signal carrier frequency in both channels to the single channel Nyquist frequency ($f_{s,path}/2$). Each channel is provided a separate high-pass $\Sigma\Delta$ modulator that performs A/D conversion. Thus, the high-pass $\Sigma\Delta$ modulators operate at half of the overall band-pass $\Sigma\Delta$ modulator speed, relaxing the speed requirement placed on analog circuits. Following A/D conversion and downsampling, the outputs of the channels are the in-phase and quadrature components of the baseband IF input signal. This circuit enables direct A/D conversion of intermediate frequency (IF) input signals without prior demodulation, which makes this design very attractive for application in the IF stage of communications systems.

An example of an enhancement to a familiar application offered by Nyquist band processing is the high-pass $\Sigma\Delta$ modulator used to digitize low-pass analog signals. A low-pass input signal is modulated with a square wave carrier to shift the input signal to the Nyquist frequency of the $\Sigma\Delta$ modulator, which contains a high-pass filter (mirrored integrator, or MI). The use of a highpass $\Sigma\Delta$ modulator to convert low-pass analog signals results in attenuated 1/f noise (similar to the chopper stabilization method, or CHS), attenuated distortion caused by DAC nonlinearities (cancellation of even-order nonlinearities), attenuated distortion from the limited voltage swing of the loop filters, and reduction of the distortion caused by quantizer clipping. In the design of a high-pass $\Sigma\Delta$ modulator a high-pass filter is used inside the modulator feedback loop. The filter must perform a mirrored integration; i.e., it must have infinite gain at the Nyquist frequency and finite gain at DC.

The signal transfer function of the MI (mirrored integrator) is shown in FIGS. 1A and 1B, where functional block diagrams and transfer functions of both delayed and non-delayed MI's, respectively, are presented. In both of the mirrored integrators, an input x[n] is received at an input 102 and applied to a subtractor 104 and thence to a circuit which includes a delay element 106 and a feedback loop 108. The resulting signal y[n] is output at an output 110. The two integrators differ in whether the delay element is located in the feedback loop or in the other arm of the circuit, which in turn affects the output as a function of the input. The mirrored integrator 100A of FIG. 1A outputs an output $$Y(z) = \frac{z^{-1}}{1+z^{-1}} X(z),$$

while the mirrored integrator 100B of FIG. 1B outputs an output $$Y(z) = \frac{1}{1+z^{-1}} X(z).$$

The CHS method together with auto-zeroing and correlated double sampling is well-established method for dealing with amplifier imperfections, [2]. The CHS method was developed first by E. A. Goldberg in 1948.

The basic principle is shown in FIG. 2. The process starts with an input signal $V_{in}(jf)$. At step 202, the input signal $V_{in}(jf)$ is multiplied by a carrier or chopper stabilization modulating signal $CS_1(t)$ having a chopper frequency $T_{chop}$. As a result of the multiplication, replicas appear at odd multiples of $T_{chop}$. The result is supplied to an amplifier, which has the effect of adding an offset and noise (primarily at low frequencies) $V_{os}+V_n$ in step 204 and then amplifying the sum in step 206. In step 208, the amplified signal is demodulated by multiplying it by a chopper signal $CS_2(t)$, which is like $CS_1(t)$ except for having a time offset $\Delta t$. The result is an output signal $V_{out}(jf)$.

After the CHS is performed, the output signal $V_{out}(jf)$ is low-pass filtered in order to attenuate ripples of the chopper frequency. The resulting signal at baseband is an amplified input signal with no low-frequency degradations (1/f noise and DC offset) caused by the filter.

Following the basic principle described above, CHS has been applied to the fully differential SC integrator by introducing chopper modulators at both the front and rear end of the amplifier, as shown in FIG. 3 and proposed in [3]. As shown in FIG. 3, the integrator 300 includes input terminals 302, 304 to receive a reference voltage $V_{ref}[n]$ and input terminals 306, 308 to receive an input voltage $V_{in}[n]$. The circuit further includes switches 310, capacitors 312 having a capacitance $C_1$, ground terminals 314, an opamp (operational amplifier) 316, feedback loops 318 with capacitors 320 having a capacitance $C_2$, and output terminals 322, 324 for outputting an ouput voltage $V_{out}[n]$. The opamp has a non-inverted input port 332, an inverted input port 334, a non-inverted output port 326, and an inverted output port 328. The switches 310 are switched in accordance with switching phases $\Phi_1$ and $\Phi_2$, a sampling phase $\Phi_s$, and an integration phase $\Phi_i$, all of which are shown in FIG. 5. As shown in FIG. 5, $\Phi_s$, and $\Phi_i$ have a first period and are inversions of each other, while $\Phi_1$ and $\Phi_2$ have a second period which is double the first period and are inversions of each other. At the output ports 326, 328 of the opamp 316, the switches 310 define two $\Phi_1/\Phi_2$ switching pairs 330. The same is true at the input ports 332, 334 of the opamp 316.

Each pair of switching pairs 330 defines a chopper stabilization modulator 336, so that there is one chopper stabilization modulator 336 connected to the input ports 332, 334 and that there is another chopper stabilization modulator 336 connected to the output ports 326, 328. The switching phases $\Phi_1$ and $\Phi_2$, in accordance to FIG. 5, define a chopper stabilization modulating signal, which is a periodic sequence of +1's and −1's with frequency equal to half the sampling frequency. The configuration of the integrator 300 defines an input circuit 338 and an output circuit 340. The significance of the input and output circuits will be explained below with reference to FIGS. 4 and 6.

A chopper frequency of $f_s/2$ has been shown to be most effective because it shifts the opamp's imperfections farthest away from the signal band. The resulting opamp noise difference equation is given in Eq. (1), where $e_{opamp}(n)$ represents the opamp noise and DC offset.

$$V_{out}(n) = (-1)^n (e_{opamp}(n) + e_{opamp}(n-1)) \quad (1)$$

Thus, the opamp noise is low-pass filtered and modulated to Nyquist frequency out of the input signal band.

One particular utility for mirrored integrators is in the $\Sigma\Delta$ analog to digital converter of the above-cited '409 patent. As taught in that patent, both delayed and non-delayed MI's can be used.

However, existing mirrored integrator designs suffer from more noise than is desirable. If noise were reduced, a variety of advantages would result, from smaller circuit design to greater dynamic range.

The references identified by numbers in brackets are the following:

[1] A. K. Ong, "Bandpass Analog-to-Digital Conversion for Wireless Applications", PhD dissertation, Stanford University, Stanford, Calif., September 1998.
[2] C. C. Enz, G. C. Temes, "Circuit Techniques for Reducing the Effects of Op-Amp Imperfections: Autozeroing, Correlated Double Sampling, and Chopper Stabilization", *Proc. of the IEEE*, Vol. 84, No. 11, November 1996.
[3] K. C. Hsieh, P. R. Gray, D. Senderowicz, and D. G. Messerschmitt "A Low-Noise Chopper-Stabilized Differential Switched-Capacitor Filtering Technique" *IEEE Journal on Solid-state Circuits*, Vol. SC-16, No. 6, December 1981.
[4] S. Bazarjani, W. M. Snelgrove, "A 160-MHz Fourth-Order Double-Sampled SC Bandpass Sigma-Delta Modulator", *IEEE Trans. on Circuits and Syst. II*, vol. 45, pp. 547–555, May 1998.

SUMMARY OF THE INVENTION

It is therefore an object of the invention to provide a mirrored integrator with improved noise characteristics.

To achieve the above and other objects, the present invention is directed to a fully differential switched-capacitor MI that will be useful for Nyquist band signal processing applications such as those described above. The present invention also uses CHS methods to obtain noise shaping properties of the MI that are comparable in magnitude, but complementary in frequency dependence, to the noise shaping of conventional integrators in which CHS methods are employed.

A new family of fully differential SC highpass filters (MI) with various delays has been proposed and analyzed. It was shown that the new MI design will be lower in noise than a comparable high-pass filter design proposed in [1]; the present invention treats the operational amplifier noise in the same manner as a fully differential SC chopper stabilized low-pass integrator.

Although the contribution of switch noise in the new design is reduced only by a factor of 2, the reduction of the operational amplifier noise is much larger. In the unit-delay MI the opamp noise contribution at the Nyquist frequency goes to zero, and in the other two members of the MI filter family the opamp noise power is reduced by a factor of 16 at the Nyquist frequency compared to the previous design, [1].

A mirrored integrator is a specific case of the present invention, namely, in which the chopper stabilization modulating signal is the alternating sequence +1, −1, +1, −1, ... However, the chopper stabilization modulating signal can be anything, for example, a random sequence of +1's and −1's. An example of another integrator within the scope of the present invention is a spread-spectrum integrator, in which the modulator is any random or pseudo-random sequence of +1's and −1's. A specific type of spread-spectrum integrator is a blue-noise integrator, in which the modulator signal is a blue-noise random or pseudo-random sequence. The use of blue noise, which has a deficiency of low-frequency spectral power, is known in other arts; however, its use in the context of the present invention is considered to be novel.

When used in $\Sigma\Delta$ analog to digital converters, the present invention offers the following advantages over the prior art:

Improved dynamic range, because higher order DAC will be allowed and a dramatic reduction in 1/f noise. The 1/f noise in typical CMOS circuits is typically below 500 kHz, which is attenuated by the high-pass filter in our design.
Reduced offset error and drift.
Dramatically lower power consumption per bit, allowing the design tradeoff of oversampling ratio for resolution.
Smaller size circuits because smaller input transistors can be used, because of the noise reduction features of the design.
Reduced analog noise.
Reduced operational amplifier analog noise (thermal+1/f).
Suppression of DAC nonlinearity.
Improved attenuation of the DAC's DC offset.
Improved stability of the Mirrored integrator to clipping of the output voltage, as compared to the integrator element of a conventional Sigma-delta design.

The present invention can be used in an ADC like that of the above-cited '409 patent.

BRIEF DESCRIPTION OF THE DRAWINGS

A preferred embodiment of the present invention and variations thereon will be disclosed with reference to the drawings, in which.

DETAILED DESCRIPTION OF THE PREFERRED EMBODIMENT

Figure 1A:
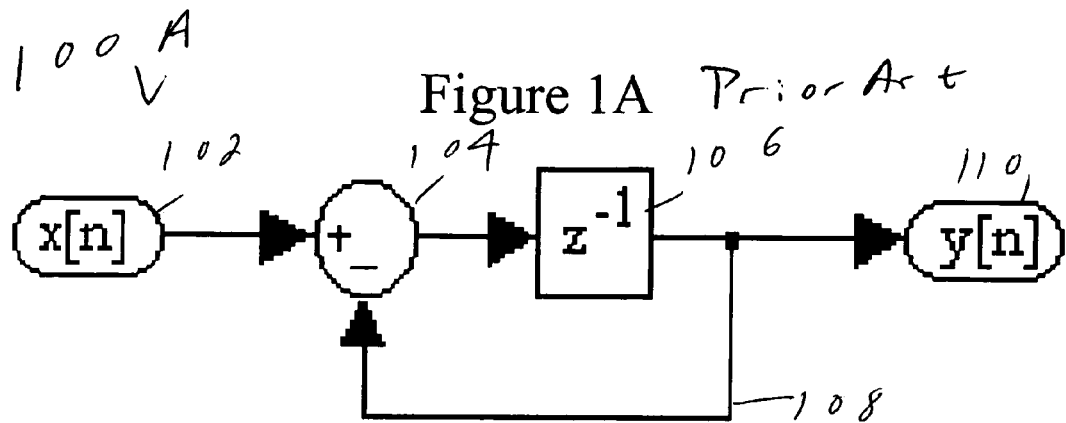
FIGS. 1A and 1B are block diagrams showing the signal transfer functions of a delayed and a non-delayed MI, respectively.
Figure 1B:
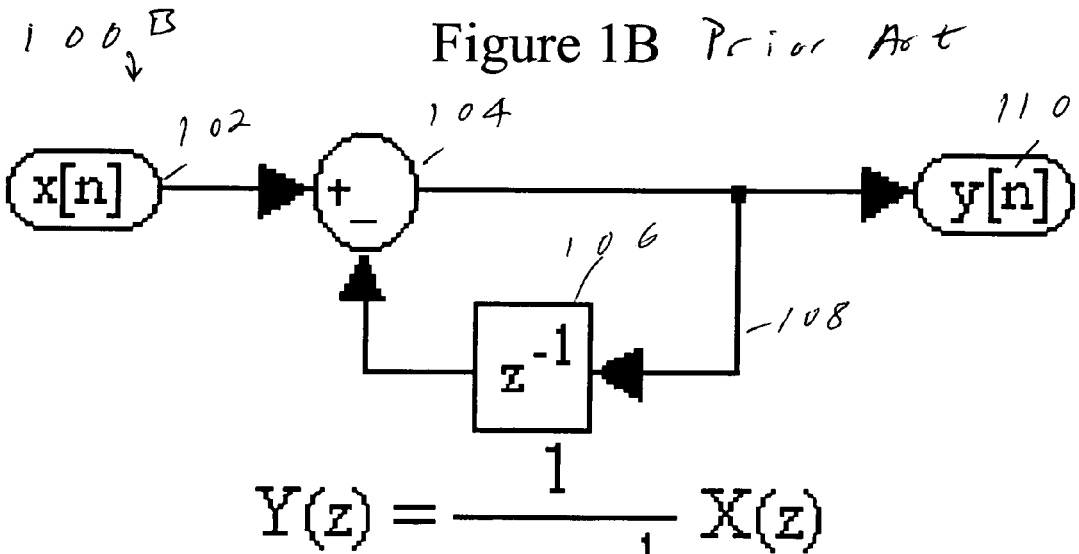

A preferred embodiment of the present invention and modifications thereon will be disclosed in detail with reference to the drawings, in which like reference numerals refer to like elements or steps throughout.

Figure 4:
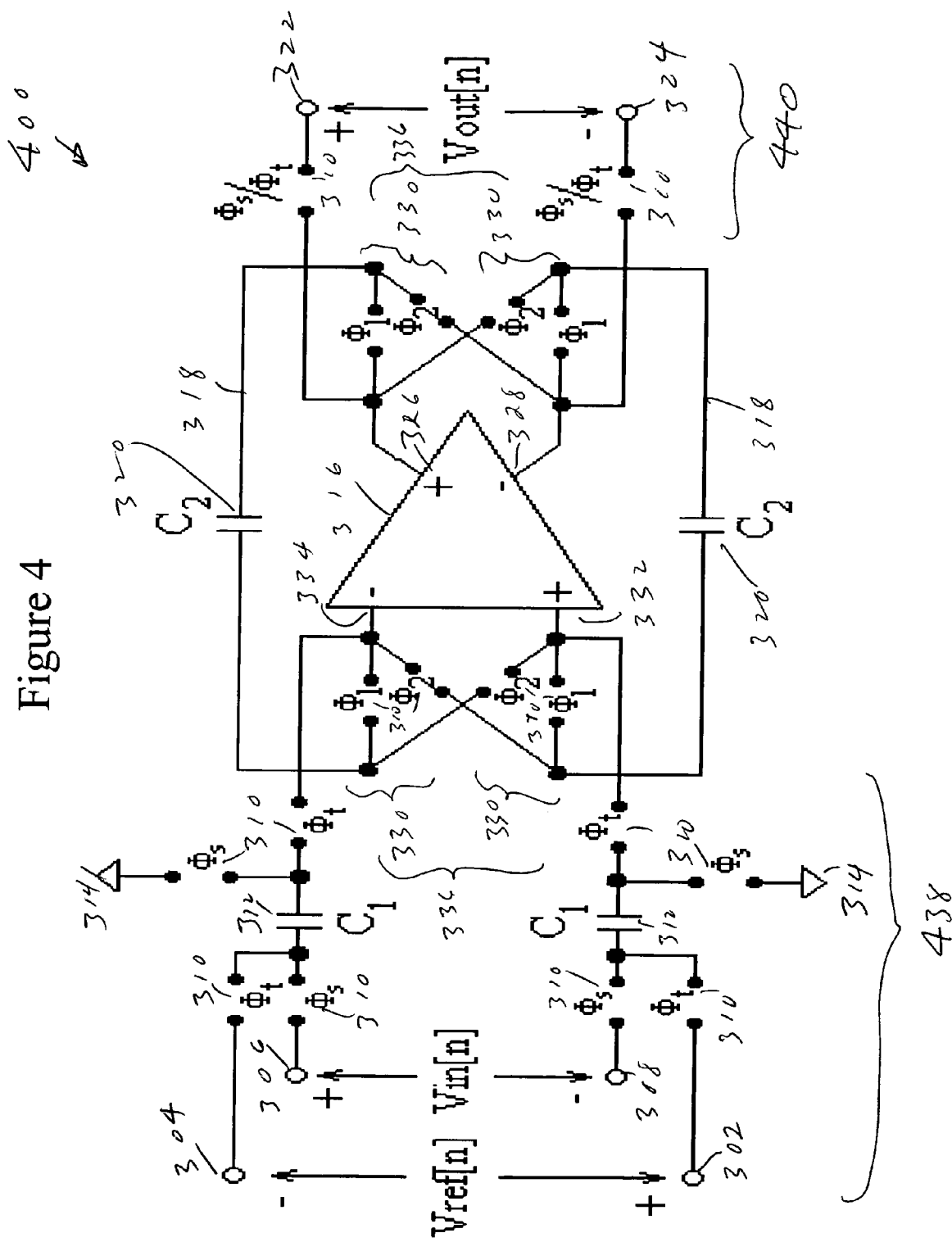
FIG. 4 is a circuit diagram showing a fully differential sample-delayed mirror integrator according to the preferred embodiment.

A fully differential, sample-delayed SC high-pass filter according to the preferred embodiment is shown in FIG. 4. As will be explained below, the high-pass filter 400 of FIG. 4 can be implemented as a fully differential sample-delayed or half-sample-delayed filter.

Figure 3:
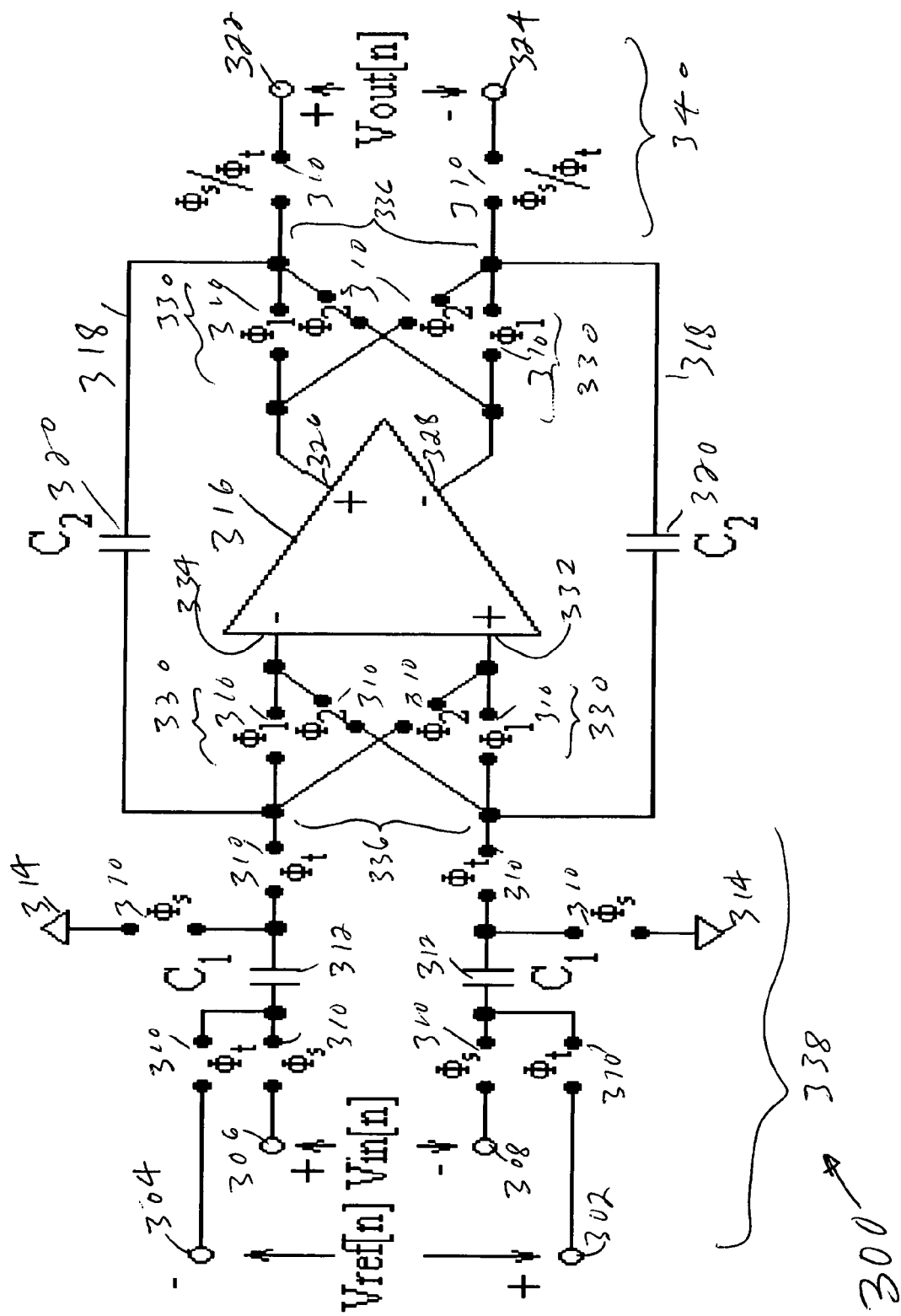
FIG. 3 is a circuit diagram showing a fully differential chopper stabilized integrator according to the prior art.
Figure 5:
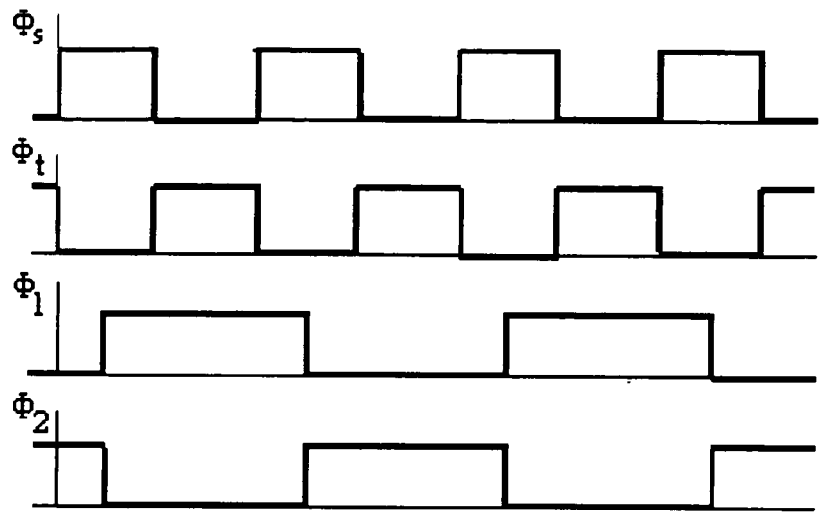
FIG. 5 is a graph of the timing sequence used in several variations of the preferred embodiment.

Comparing the high-pass filter 400 in FIG. 4 to the low-pass filter 300 shown in FIG. 3, we note that in the high-pass filter 400, the input circuit 438 and the output circuit 440 are connected directly to the opamp's input and output ports 326, 328, 332, 334, as opposed to the low-pass filter 300 of FIG. 3, in which the input and output are taken through the switching pairs (the $\Phi_1$ and $\Phi_2$ pairs) 330. When the output signal is taken at the end of the sampling phase $\Phi_s$, and with the timing sequence shown in FIG. 5, the configuration of the filter 400 results in a sample-delayed filter having the signal transfer function (STF) given by Eq. (2).

$$V_{out}(z^{-1}) = \frac{C_1}{C_2} \frac{z^{-1}}{1+z^{-1}} (V_{in}(z^{-1}) + V_{ref}(z^{-1})) \tag{2}$$

This signal transfer function represents a sample-delayed MI, with infinite gain at the Nyquist frequency and a gain of $C_1/2C_2$ at DC.

In higher order $\Sigma\Delta$ modulators, it is almost always required to have integrators with different delays. Therefore, a complete set of MI filters with various delays has been designed. In FIG. 4, when the output signal is taken at the end of the integration phase $\Phi_I$, resulting in $z^{-0.5}$ delay in the output with respect to the input signal samples, the half-sample-delayed MI design is obtained. This design results in the STF shown in Eq. (3).

$$V_{out}(z^{-1}) = \frac{C_1}{C_2} \frac{z^{-0.5}}{1+z^{-1}} (V_{in}(z^{-1}) + V_{ref}(z^{-1})) \tag{3}$$

Figure 6:
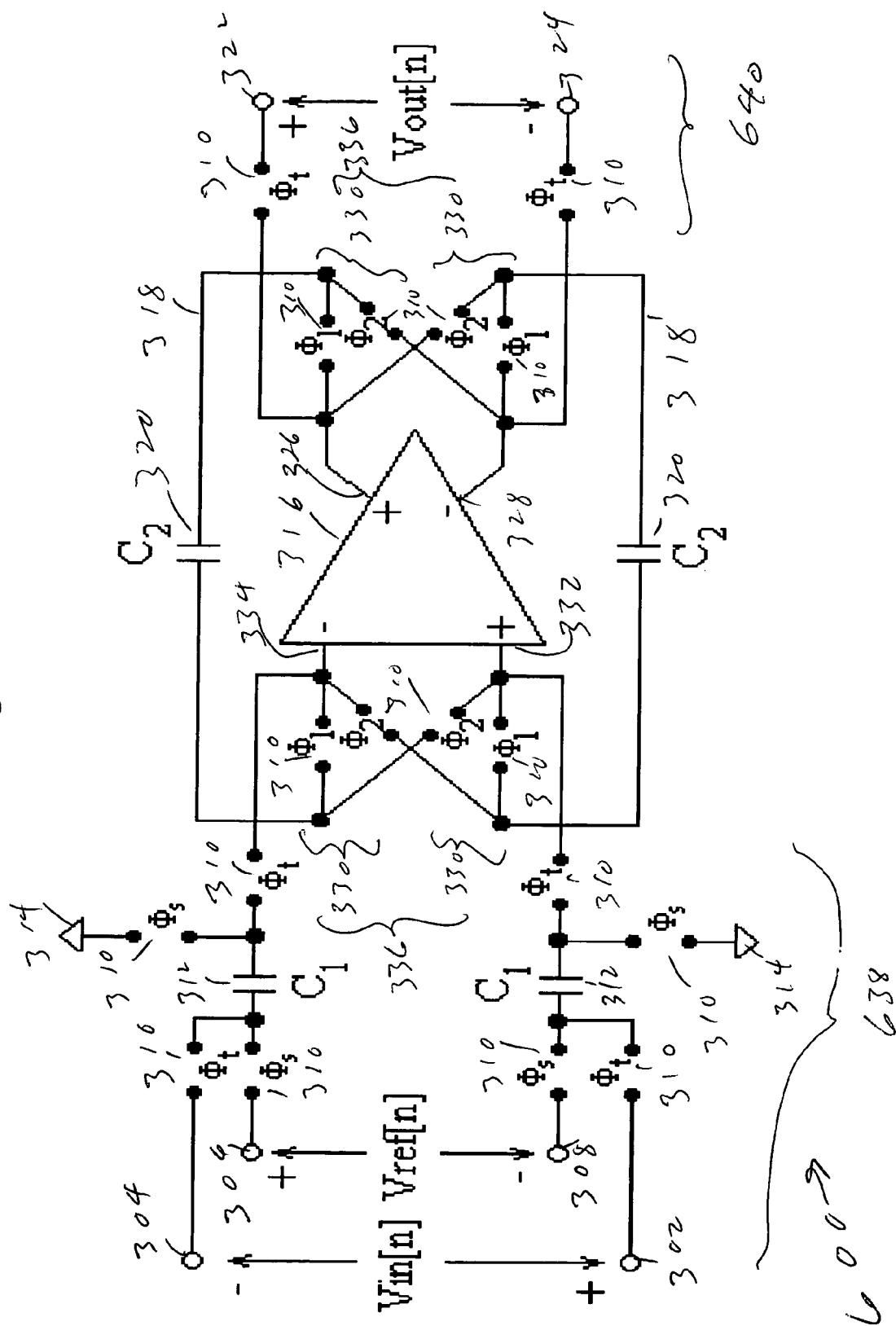
FIG. 6 shows a circuit diagram of a fully differential non-delayed MI according to the preferred embodiment.

In order to obtain a non-delayed MI, the input and reference signals must be interchanged. The non-delayed SC MI is shown in FIG. 6. In the non-delayed SC MI 600, the input and output signal samples are taken at the end of integration phase $\Phi_I$. Thus, the input circuit 638 and the output circuit 640 are modified from those of FIG. 4. This configuration results in STF given in Eq. (4).

$$V_{out}(z^{-1}) = \frac{C_1}{C_2} \frac{1}{1+z^{-1}} (V_{in}(z^{-1}) + V_{ref}(z^{-1})) \tag{4}$$

We will now present a model and make an estimate of the noise magnitude of the MI. We show that the noise of the MI filter design will be significantly lower than the noise of the previously proposed high-pass integrator, [1]. Switched-capacitor filters introduce noise that arises from two statistically independent sources: the noise generated by the switches and the operational amplifier noise. In the following we discuss the switch noise and opamp noise in greater detail.

Switch noise will now be discussed. There are three independent noise mechanisms associated with MOS switches: thermal noise, flicker (1/f) noise, and shot noise. Shot and flicker noise can be neglected because on average the currents flowing through the filter's switches are equal to zero. Thus, the thermal noise of the switches is the remaining source of fluctuations that could potentially degrade the filter's performance. The source of the thermal noise in MOS switches is the nonzero resistance of the MOS channel.

Figure 7A:
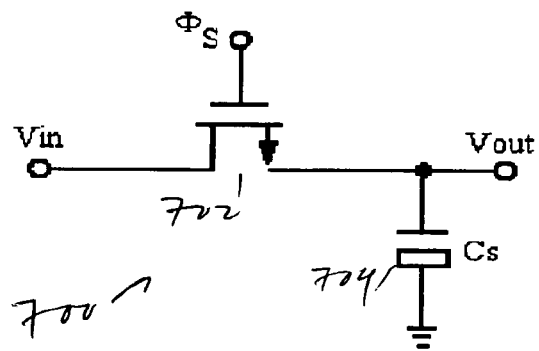
FIGS. 7A and 7B are a circuit diagram of a MOS switch and a block diagram of a noise model for the MOS switch, respectively.
Figure 7B:
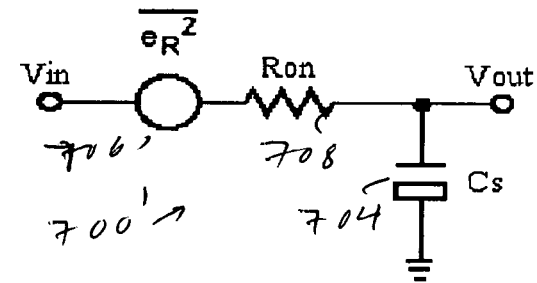

In order to estimate the switch noise contributed by the MOS switches, the sample- and hold circuit model has been used, as shown in FIGS. 7A and 7B. FIG. 7A shows a sample-and-hold circuit 700 having a MOS transistor (switch) 702 and a capacitor 704 with a capacitance $C_s$. FIG. 7B shows a block diagram of a noise model 700' for the switch 700 when the switch is on. The noise model 700' has a zero-mean noise sample 706 with a mean square noise power $\overline{e_R^2}$ and a noiseless resistor 708 representing the MOS channel resistance of the transistor 702 when the transistor is on. The power spectral density of thermal noise generated in the MOS-switch channel is given by Eq. (5).

$$S_{thermal}(f) = 4kTR_{on} \left[\frac{V^2}{Hz}\right] \tag{5}$$

where k is Boltzmann's constant, T is the absolute temperature, and $R_{on}$ is the MOS channel resistance.

By examining FIG. 7B, one sees that the noise source undergoes single-pole low-pass filtering. The resulting total noise power is given by Eq. (6).

$$e_{switch}^2 = \tag{6}$$

$$\int_0^\infty S_{out}(f)\,df = \int_0^\infty \frac{4kTR_{on}}{1+(2\pi \cdot f \cdot R_{on} \cdot C_s)^2}\,df = \frac{kT}{C_s}[V^2]$$

If we assume that $R_{on} \sim 100$ Ohm and $C_s \sim 1$ pF, the $-3$ dB frequency of the equivalent low-pass filter is near 7 GHz. At the same time, the highest achievable sampling frequency in modern CMOS $\Sigma\Delta$ modulators is on the order of 80 MHz [4]. Thus, the switch thermal noise appears as white noise in the sampling bandwidth $[-f_s/2, f_s/2]$ with noise power spectral density given in Eq. (7).

$$S_{switch}(f) = \frac{kT}{f_s \cdot C_s}\left[\frac{V^2}{Hz}\right] \quad (7)$$

Now we may calculate the noise contributions of the switches to the filter's total input referred noise. The capacitors 312 $C_1$ and 320 $C_2$ (FIG. 4) add switch noise directly to the input and output signal, respectively. Thus, when referred to the input, the noise power generated at a capacitor 312 $C_1$ is not changed, and the noise at a capacitor 320 $C_2$ is shaped by the filter's transfer function $(1/|H_{M1}(f)|)^2$. The total input referred power spectral density of the filter's switch noise is therefore given by Eq. (8).

$$S(f) = \frac{2kT}{f_s}\left(\frac{2}{C_1} + \frac{4}{C_2}\left(1 + \cos\left(\frac{2\pi \cdot f}{f_s}\right)\right)\right)\left[\frac{V^2}{Hz}\right] \quad (8)$$

Comparing Eq. (8) to the input referred switch noise of the design given in [1], we see that the switch noise sampled at $C_1$ contributes the same to the overall noise in both designs. However, in our design the switch noise sampled at $C_2$ makes a significantly smaller contribution to the noise near the Nyquist frequency in comparison to the design in [1] and is negligible compared to the noise sampled at $C_1$. The resulting total switch noise power is given in Eq. (9).

$$e^2_{switch\_total} = \frac{4kT}{C_1}[V^2] \quad (9)$$

The conclusion of the foregoing analysis is that the total input referred switch noise power in the MI design is one-half that of the design given in [1].

We proceed with an estimate of the amplifier noise contribution to the filter's noise for each of the high-pass filters with different delays. We will assume that, as shown in the noise model 800 of FIG. 8, both the input signal and the reference signal are equal to zero, and that the opamp's noise is symmetrically divided between noise sources 802 and 804 the inverting and non-inverting opamp inputs. Dividing the opamp noise into two symmetrical correlated noise sources does not cause loss of generality but is a convenient method to perform noise analysis.

Figure 8:
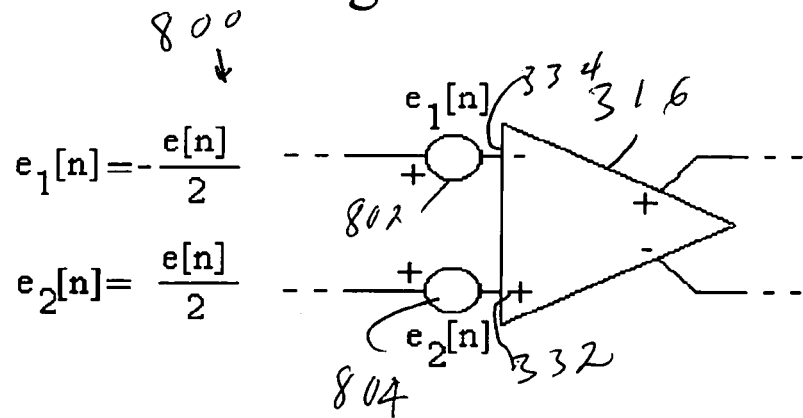
FIG. 8 is a block diagram of a noise model used to estimate opamp noise.

In FIG. 8, $e[n]$ represents the opamp noise sample at time instance n. The opamp noise is the sum of a thermal noise term, which is flat over the entire frequency range, and 1/f noise that is dominant at lower frequencies.

In a sample-delayed MI design, where the output samples are taken during the sampling phase, the opamp noise transfer function is given in Eq. (10).

$$H_e(z) = \frac{V(z)}{E(z)} = -\frac{1 + \frac{C_1}{C_2}z^{-0.5} + z^{-1}}{1 + z^{-1}} \quad (10)$$

The input referred opamp noise is given in Eq. (11).

$$E_{in}(z) = H_{in}(z) \cdot E(z) = -\left(1 + \frac{C_1}{C_2}z^{-0.5} + z^{-1}\right) \cdot E(z) \quad (11)$$

If we evaluate the transfer function $H_{in}(z)$ along the unit circle in the z-plane, and assume that the opamp noise sample values at various delays $(1, z^{-0.5}$ and $z^{-1})$ are uncorrelated, the resulting frequency transfer function $H_{in}(j\omega)$ is given by Eq. (12).

$$H_{in}(j\omega) = -(1 + \exp(-j\omega)) \quad (12)$$

From Eq. (12) it can be seen that the input referred amplifier noise in the MI undergoes low-pass filtering; the DC component is amplified by a factor of 2, and the highest frequency component, $\omega = \pi$, is attenuated to zero. This is contrasted to the design of the high-pass filter proposed in [1] in which the input referred amplifier noise undergoes differentiation, i.e., it is multiplied by $(1-\exp(j\omega))$. Thus, unlike the design proposed in [1] in which the amplifier noise near the Nyquist frequency is amplified by a factor of 4, the new MI design reduces the noise power at the Nyquist frequency to zero. Furthermore, Eq. (12) shows that the new high-pass filter design reduces the contribution to the amplifier noise in much the same manner as the SC integrator design employing the CHS method, which was one of the goals of our design.

In a half-sample-delayed MI design, the opamp noise transfer function is given by Eq. (13).

$$H_e(z) = \frac{V(z)}{E(z)} = -\frac{1 + \frac{C_1}{C_2} + z^{-1}}{1 + z^{-1}} \quad (13)$$

The input referred opamp noise is given by Eq. (14).

$$E_{in}(z) = H_{in}(z) \cdot E(z) = -\left(1 + \frac{C_1}{C_2} + z^{-1}\right) \cdot E(z) \quad (14)$$

From Eq. (14) it can be seen that the input referred amplifier noise undergoes low-pass filtering, similar to the sample-delayed high-pass filter. However the half-sample delayed high pass filter does not completely attenuate the Nyquist frequency to zero, but rather it has a power gain of $(C_1/C_2)^2$ at the Nyquist frequency. In most $\Sigma\Delta$ applications with half-sample delayed filters, the optimal value for $(C_1/C_2)$ is ½ resulting in power gain of ¼ at the Nyquist frequency.

With regard to a non-delayed MI design, we can state that in both the half-sample delayed and non-delayed designs the amplifier noise "sees" the same structure looking toward the front-end (input) of the circuit. Therefore, the nondelayed design has the same noise shaping properties as the half-sample delayed design.

In all MI designs, the opamp 1/f noise remains near DC, far from the signal band and thus it may be neglected.

As noted above, the mirrored integrator 400 or 600 (non-delayed, half-sample delayed, or sample-delayed) can be used in a ΣΔ analog-to-digital converter such as that of the above-cited '409 patent. That patent teaches both single-stage and multiple-stage ADC's, and the mirrored integrator 400 or 600 can be used in either.

Figure 2:
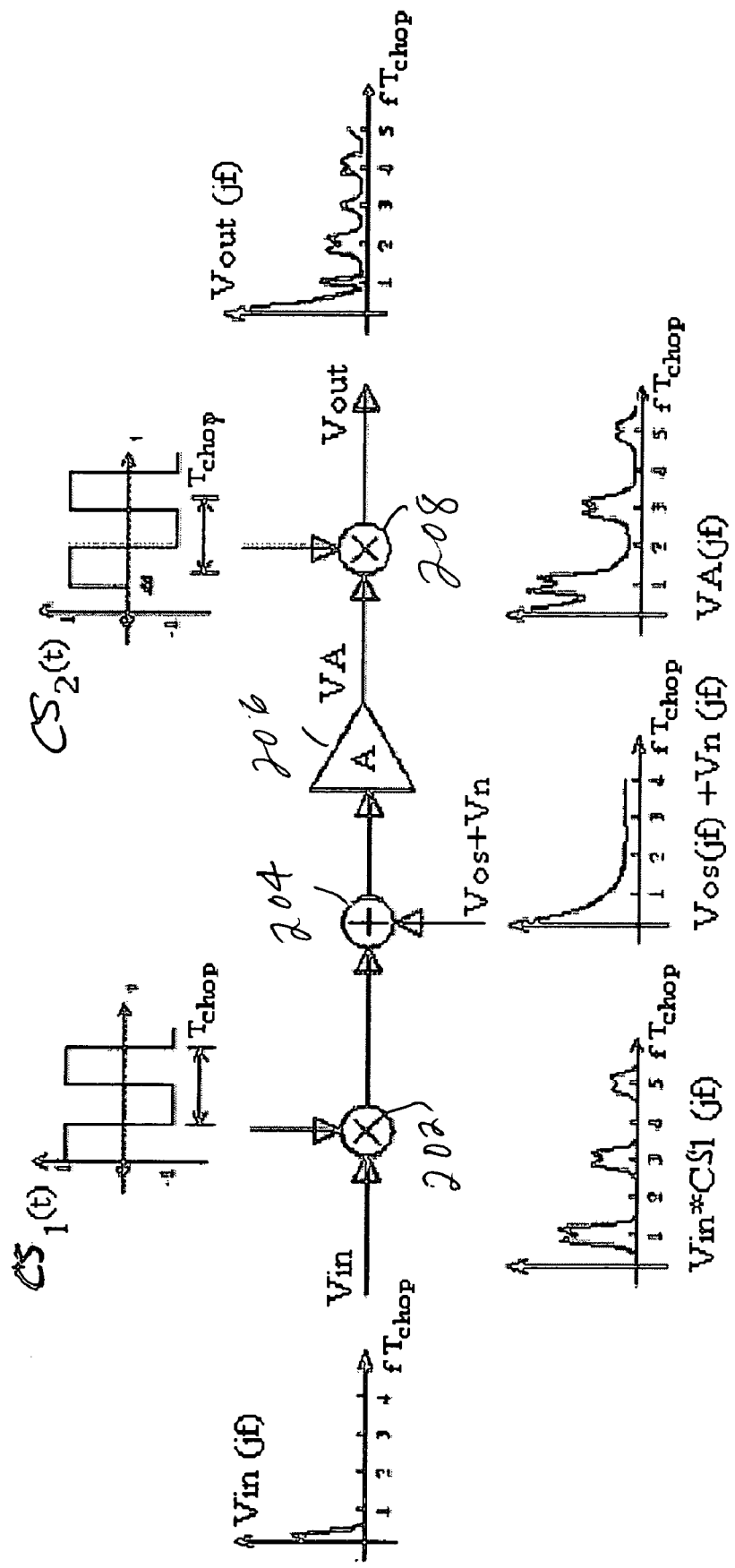
FIG. 2 shows the chopper stabilization principle according to the prior art.

An illustrative example will be given with reference to FIG. 9, which is based on FIG. 2A of the '409 patent. In the ADC 900, an analog signal received at an input 902 is applied to a multiplier 904. A chopper signal generator 906, under control of a sampling clock 908, produces a chopper signal having a frequency that is equal to one-half of the sampling frequency, i.e., equal to the frequency of $\Phi_1$ or $\Phi_2$. The chopper signal is a square wave alternating between +1 and −1 and is also applied to the multiplier 904. The product is applied to an adder 910, where a feedback signal (to be described later) is added to the product output from the multiplier 904. The resulting signal is integrated in a mirrored integrator 400 or 600, and the resulting integrated output is applied to a quantizer 912 to produce a digital number representing a level of the integrated output. The digital number output by the quantizer 912 is applied to a digital-to-analog converter (DAC) 914 to provide the feedback signal noted above. The digital number output by the quantizer 912 is also applied to a digital high-pass FIR filter 916, where it is high-pass-filtered, and to a downsampler 918, where it is downsampled. The resulting digital signal is output at an output 920.

Figure 10:
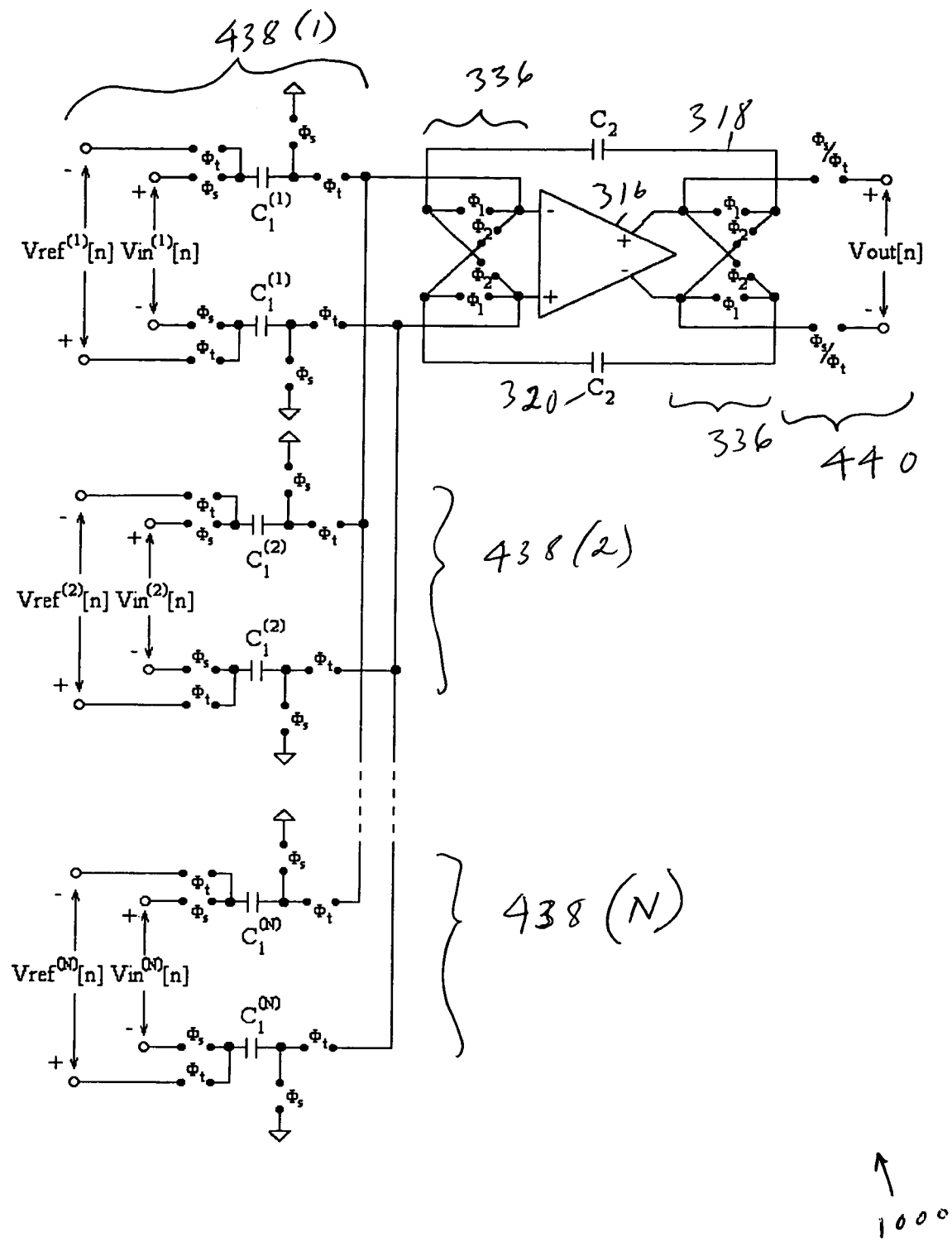
FIG. 10 shows a circuit diagram of a fully differential multiple-input sample-delayed mirror integrator according to the preferred embodiment.

The mirrored integrator can be designed to support multiple input signals, as shown in FIG. 10. In the mirrored integrator 1000 of FIG. 10, each input signal $V_{in}^{(k)}(n)$, k=1, 2, ... N, along with associated reference signal $V_{ref}^{(k)}(n)$, is provided with its own input circuit 438(1), 438(2), ... 438(N). The input circuits may have different sampling capacitance $C_1^{(k)}$, thus allowing different gains, given by $C_1^{(k)}/C_2$, for different input signals. The input signals and their reference signals, either all of them or just some of them, can be interchanged in order to provide different delay designs (sample-delayed, half-sample-delayed, and non-delayed design).

While a preferred embodiment of the present invention and various modifications thereof have been set forth above, those skilled in the art who have reviewed the present disclosure will readily appreciate that other embodiments can be realized within the scope of the invention. For example, teachings of numerical values are illustrative rather than limiting, as are teachings of specific circuit elements. Also, a modulator or converter as recited in the claims could be implemented in any of several ways, including a single chip, discrete elements, a programmed computing device, or optical computing.

Figure 11A:
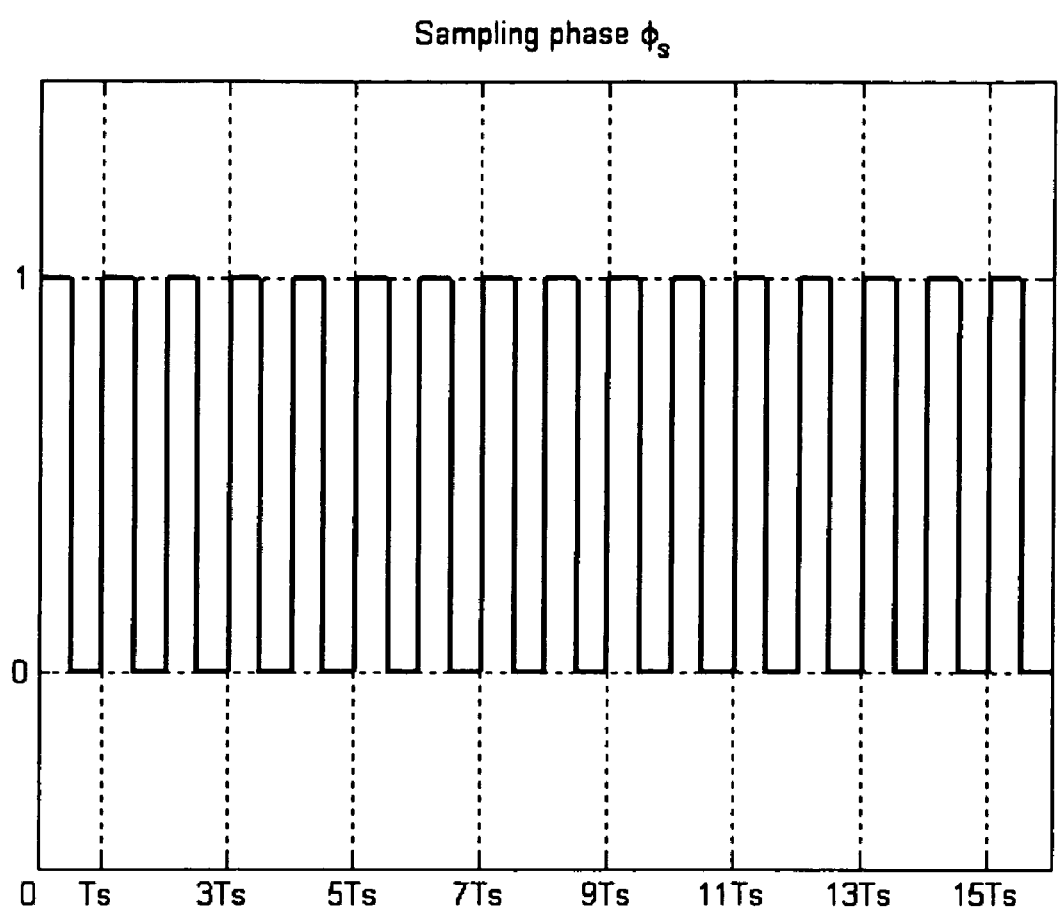
FIGS. 11A–11D show timing diagrams for: a) the sampling phase of the clock, b) a periodic chopper signal with frequency equal to one-half the sampling frequency, c) a pseudo-random chopper signal, and d) a pseudo-random chopper signal with blue-noise spectral properties, respectively.
Figure 11B:
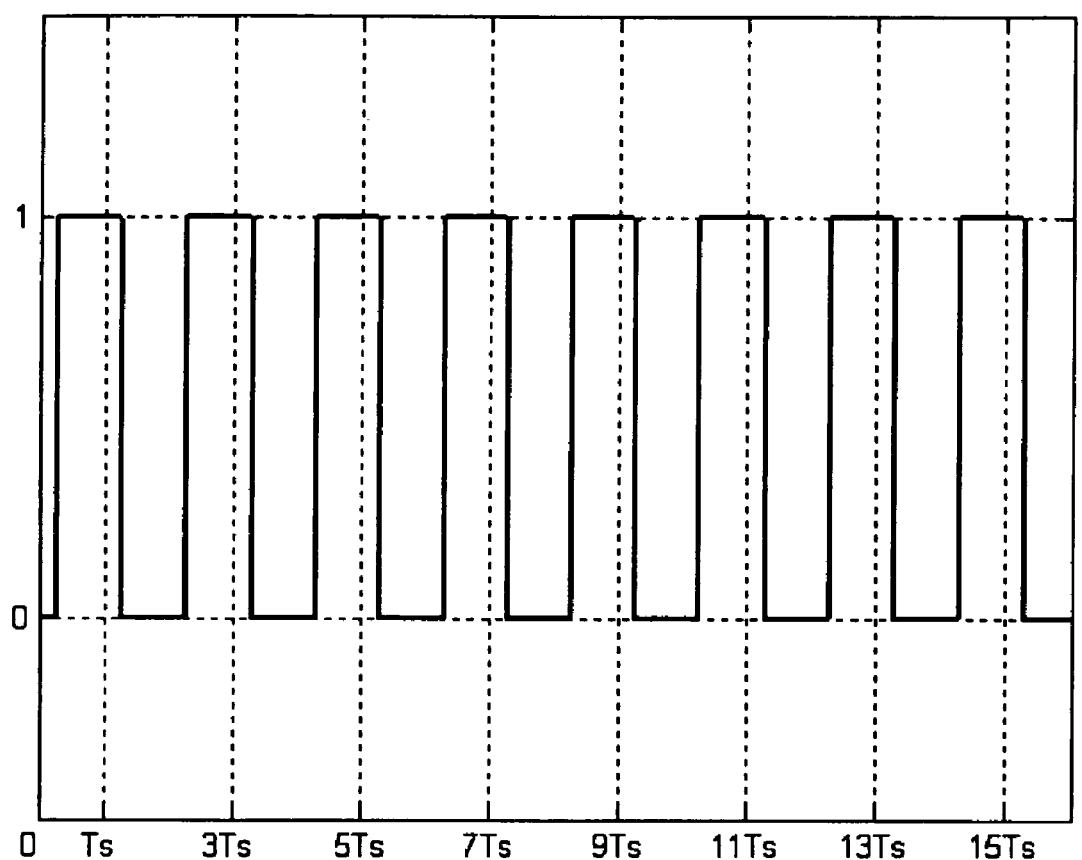
Figure 11C:
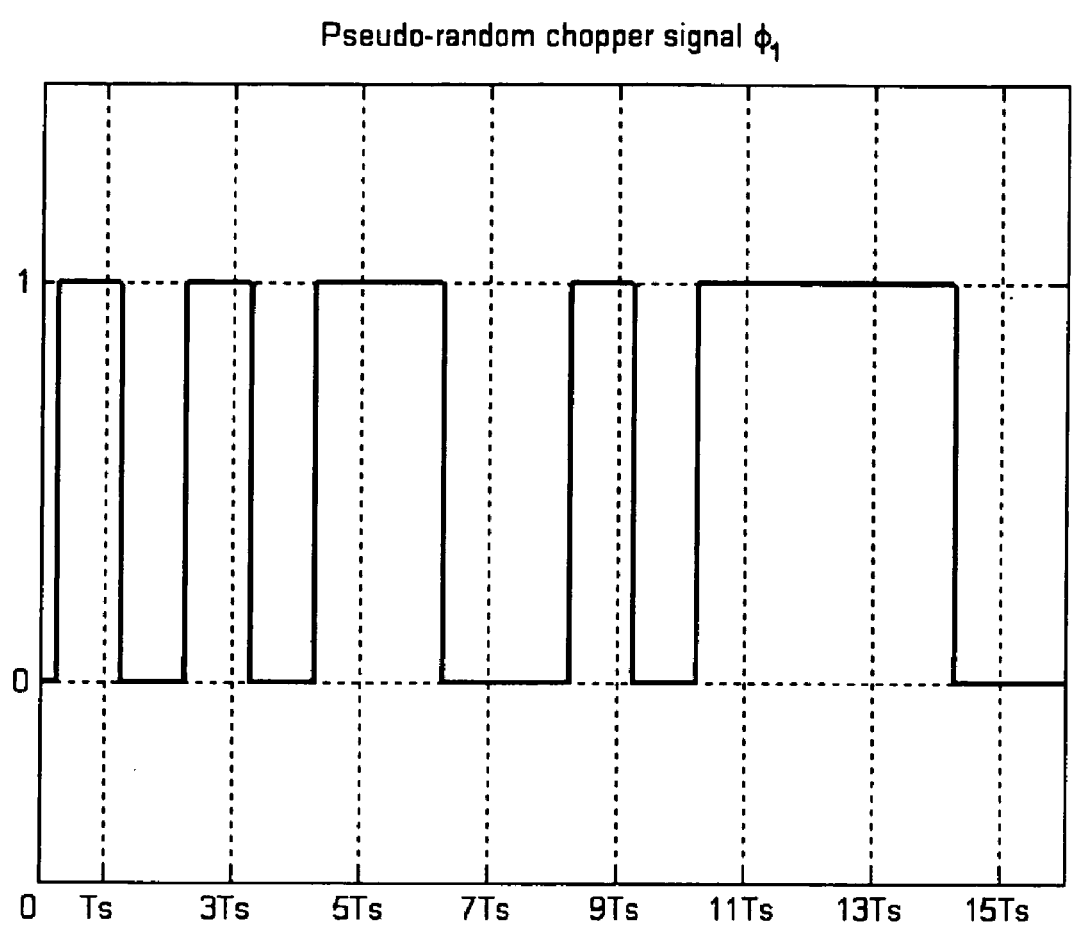
Figure 11D:
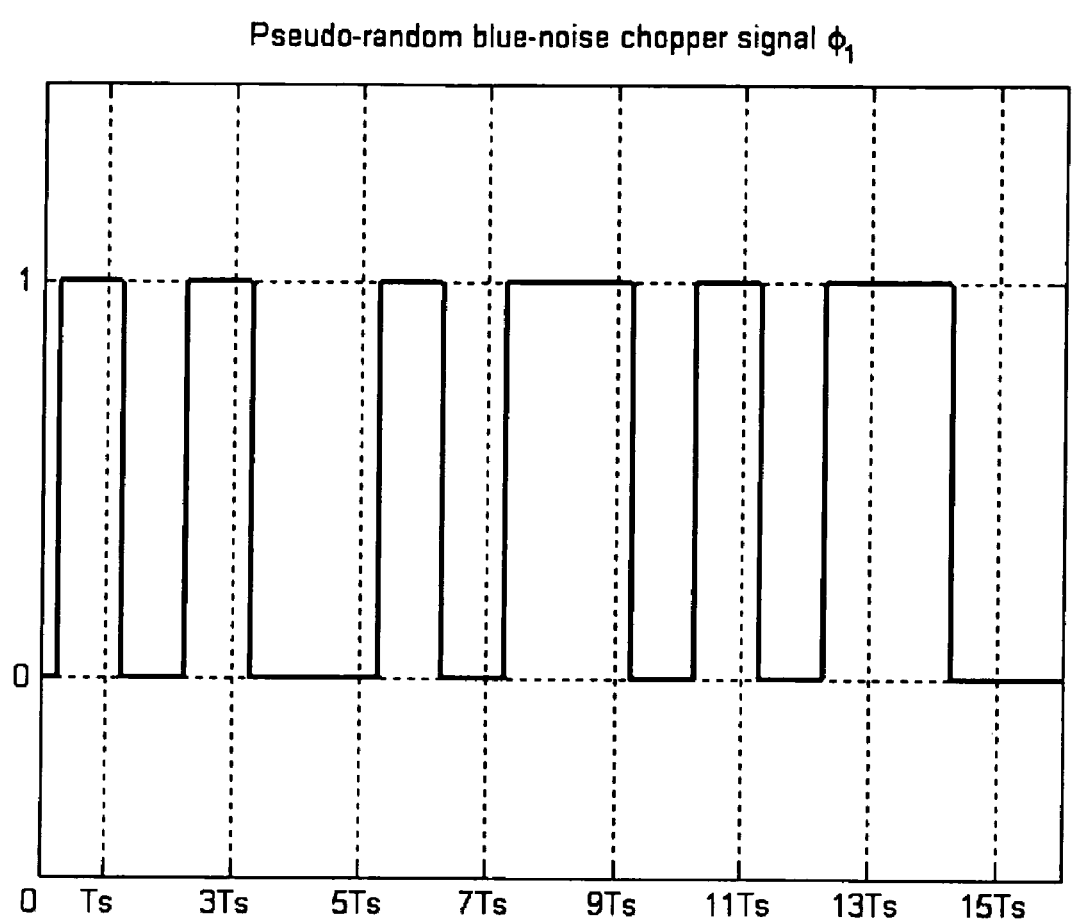
Figure 12A:
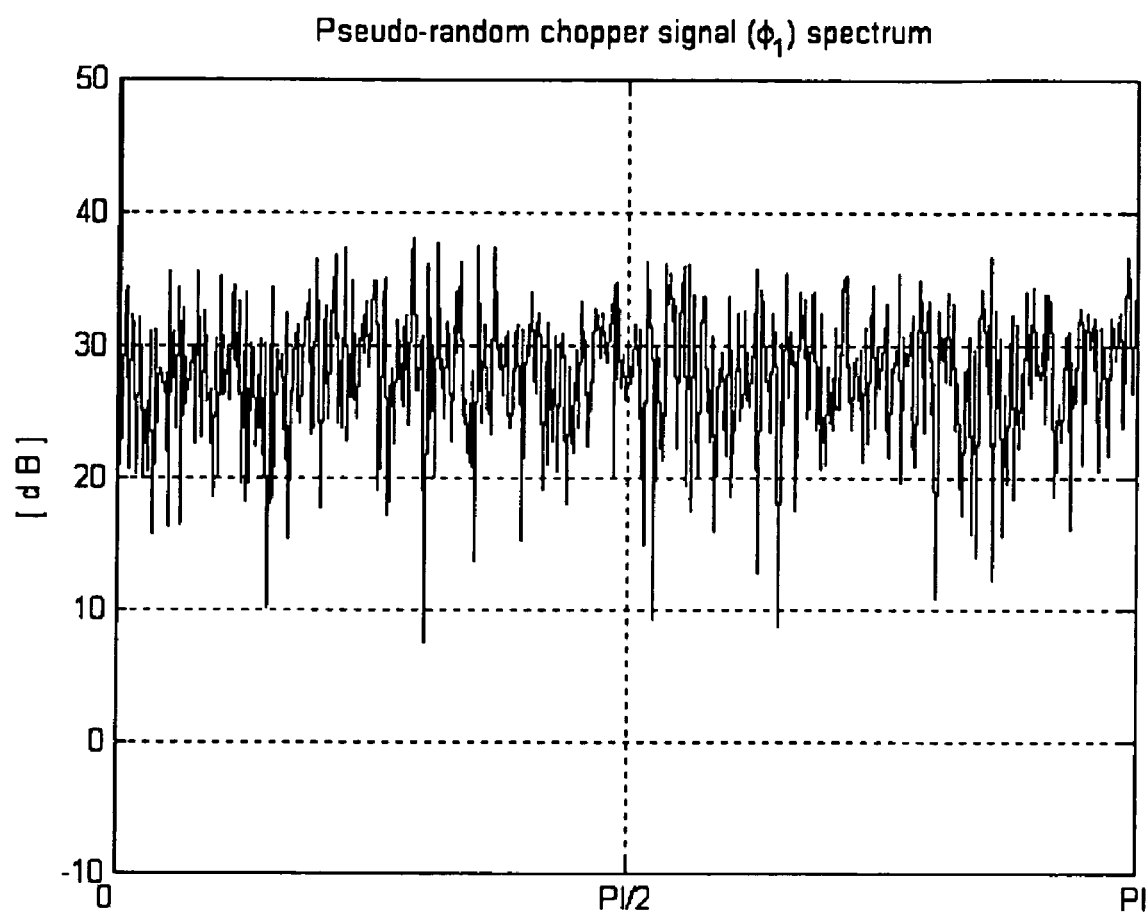
FIGS. 12A and 12B show a) a spectrum of a pseudo-random chopper sequence, and b) a spectrum of the pseudo-random blue-noise sequence, respectively.
Figure 12B:
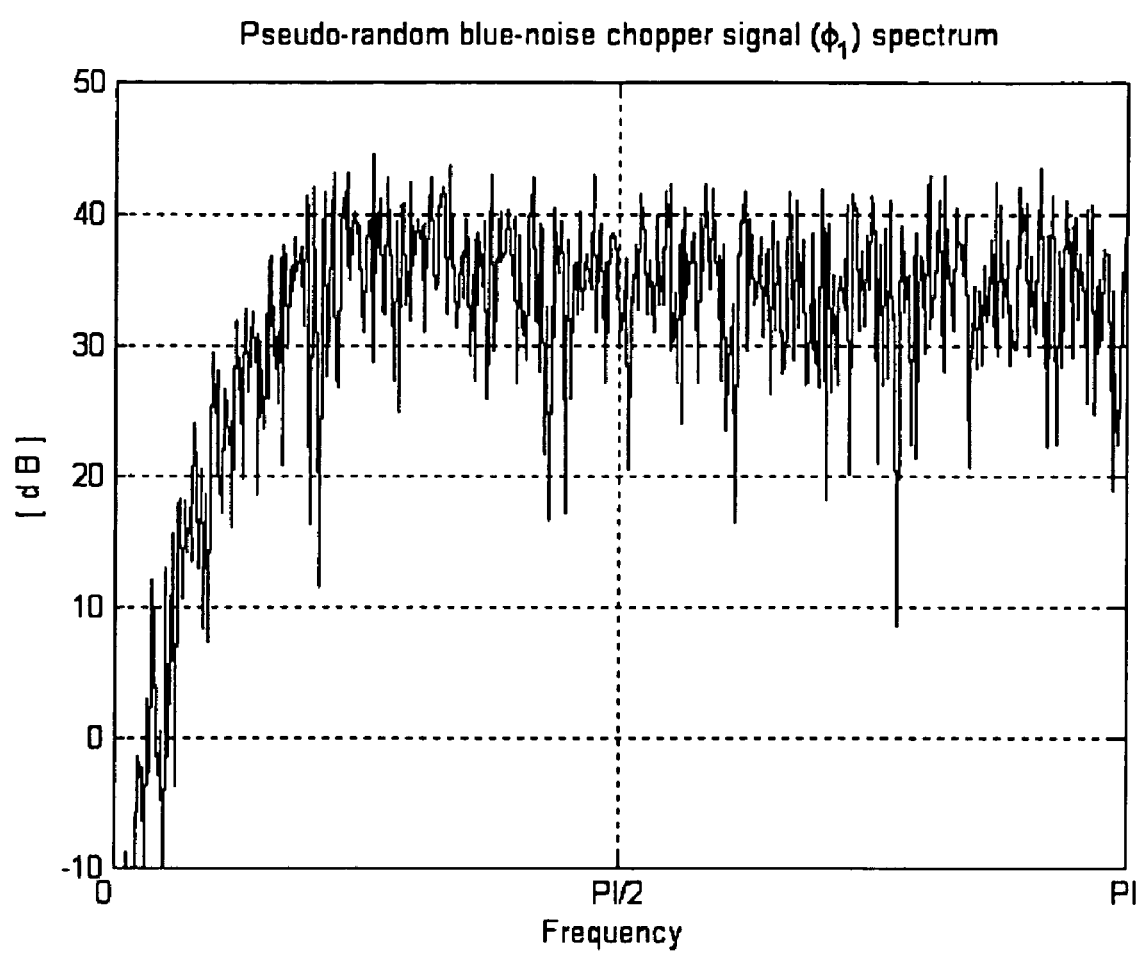

Moreover, as noted above, the chopper stabilization modulating signal can be any appropriate signal, including a random or pseudo-random signal, to provide a blue-noise integrator or another suitable integrator. When the chopper stabilization modulating signal is a periodic signal as shown in FIG. 11B, and it is applied to integrators 400 and 600, the circuit performs mirrored integration, as explained above. However, when the chopper stabilization modulating signal is a random or pseudo-random sequence and it is applied to integrators 400 and 600, the circuit performs a spread-spectrum integration. An example of such a random sequence is shown in FIG. 11C with its spectrum shown in FIG. 12A. In order to describe the spread-spectrum integration we recall that the integrator is a filter that amplifies a DC input signal with an infinite gain, which corresponds to a constant chopper modulating signal. Also, the mirrored integrator is a filter that amplifies, with an infinite gain, an input signal at the frequency of the periodic chopper modulating signal (the alternating sequence) at Nyquist frequency. Accordingly, we define a spread-spectrum integrator as a filter that amplifies an input signal that is coherent with the random chopper modulating signal, with an infinite gain. Thus, the spread-spectrum integrator effectively integrates an input signal that has undergone a spread of its spectrum. The spread-spectrum approach has been proven to increase the signal-to-noise ratio in digital communications. However, if the random chopper modulating sequence is white, it is likely that the power of low-frequency non-idealities such as 1/f noise, DC offset and offset drift would leak into the input signal band. Thus, in order to attenuate low-frequency non-idealities, the chopper stabilization modulating random sequence may have a deficiency of low-frequency spectral power (blue-noise). An example of the blue-noise chopper sequence is shown in FIG. 11D with its spectrum shown in FIG. 12B. The resulting blue-noise integrator has advantages of both the mirrored and spread-spectrum integrators. In the blue-noise integrator, an input signal would be shifted to the Nyquist frequency allowing attenuation of the low-frequency non-idealities, similar to mirrored integration, and also it would undergo a spectrum spread, thus accommodating signal-to-noise ratio increase as in spread-spectrum integration.

Figure 9:
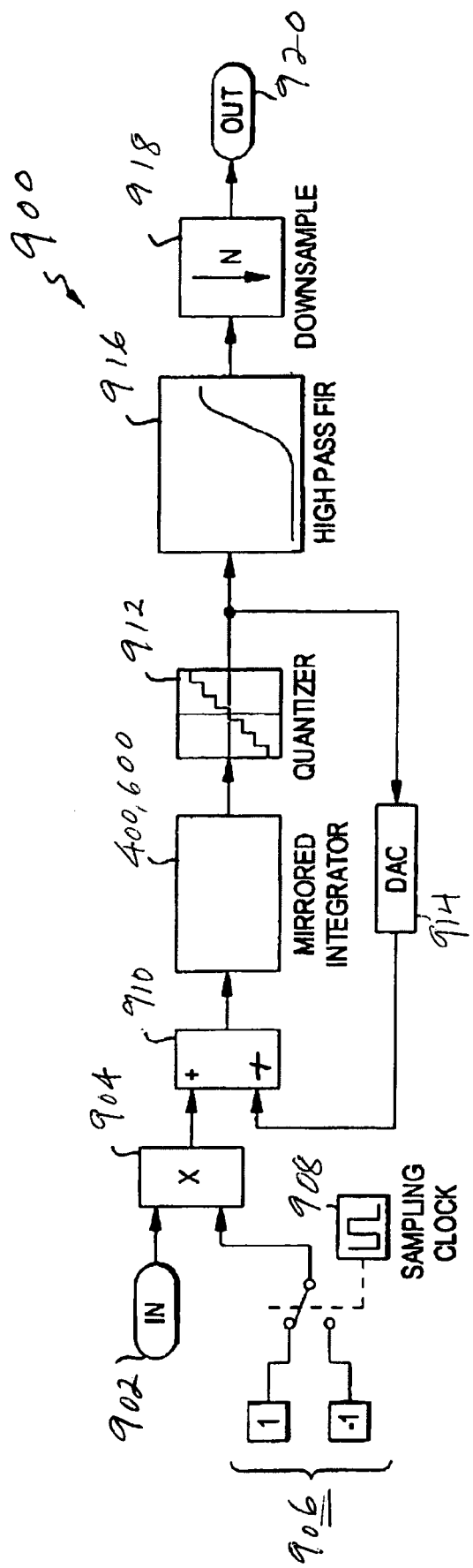
FIG. 9 is a block diagram of the $1^{st}$ order $\Sigma\Delta$ analog to digital converter using the mirrored integrator of the preferred embodiment.

Furthermore, the integrator of the present invention has a wide range of uses beyond that shown in FIG. 9, which is intended as illustrative rather than limiting. Therefore, the present invention should be construed as limited only by the appended claims.

We claim:

1. An integrator comprising:
   an operational amplifier having input ports and output ports;
   a first chopper stabilization modulator connected to the input ports;
   a second chopper stabilization modulator connected to the output ports;
   a plurality of feedback loops, each comprising a capacitor, connecting the second chopper stabilization modulator to the first chopper stabilization modulator;
   an input circuit for receiving a reference voltage and an input voltage and for supplying the reference voltage and the input voltage in alternation to the input ports of the operational amplifier while bypassing the first chopper stabilization modulator; and
   an output circuit for receiving an output voltage from the output ports of the operational amplifier while bypassing the second chopper stabilization modulator.

2. The integrator of claim 1, wherein the input circuit comprises:
   first switches for receiving the reference voltage during an integration phase; and
   second switches for receiving the input voltage during a sampling phase which is an inversion of the integration phase.

3. The integrator of claim 2, wherein the output circuit comprises third switches for outputting the output voltage during the sampling phase.

4. The integrator of claim 2, wherein the output circuit comprises third switches for outputting the output voltage during the integration phase.

5. The integrator of claim 1, wherein the input circuit comprises:

first switches for receiving the input voltage during an integration phase; and second switches for receiving the reference voltage during a sampling phase which is an inversion of the integration phase.

6. The integrator of claim 5, wherein the output circuit comprises third switches for outputting the output voltage during the integration phase.

7. The integrator of claim 1, wherein the input circuit samples the input voltage at a sampling frequency, and wherein the first and second chopper stabilization modulators operate in accordance with a chopper stabilization modulating signal which is an alternating sequence at one-half of the sampling frequency to create a mirrored integrator.

8. The integrator of claim 1, wherein the first and second chopper stabilization modulators operate in accordance with a chopper stabilization modulating signal which is a random or pseudo-random alternating sequence with chosen spectral characteristics to create a spread-spectrum integrator.

9. The integrator of claim 1, wherein the first and second chopper stabilization modulators operate in accordance with a chopper stabilization modulating signal which is a random or pseudo-random alternating sequence with a deficiency of low-frequency spectral power to create a blue-noise integrator.

10. The integrator of claim 1, comprising a plurality of said first input circuits which are connected to the input ports of the operational amplifier.

11. The integrator of claim 10, wherein the plurality of input circuits are connected in parallel to the input ports of the operational amplifier.

12. The integrator of claim 11, wherein the plurality of input circuits have different sampling capacitances.

* * * * *